Feb. 9, 1971 KOZO UCHIDA 3,562,670

DELAYED PULSE SIGNAL GENERATOR

Filed May 8, 1969 2 Sheets-Sheet 1

3,562,670
DELAYED PULSE SIGNAL GENERATOR
Kozo Uchida, Tokyo, Japan, assignor to Iwatsu Electric Co., Ltd., Tokyo, Japan, a corporation of Japan
Filed May 8, 1969, Ser. No. 823,101
Claims priority, application Japan, May 28, 1968, 43/36,162
Int. Cl. H03k 17/28
U.S. Cl. 331—173 6 Claims

ABSTRACT OF THE DISCLOSURE

A delay pulse signal generator for generating a delayed pulse in response to an input pulse includes an oscillator which initiates oscillation when an input pulse is applied to its input terminal, and a detecting circuit which detects a predetermined number of cycles of oscillation of the oscillator and then provides the delayed pulse.

FIELD OF THE INVENTION

The invention relates to a delayed pulse signal generator which generates an output pulse at its output terminal with a delay of predetermined time after an input pulse is applied to its input terminal.

THE PRIOR ART

The simplest conventionally used such generator is a delay line, in which the delay is developed in the line. In a delay line, the stability of delay time is extremely high, but the line must be extended if the delay time is to be prolonged. This results in substantial attenuation of the input pulse, particularly the front edge of a pulse containing many high-frequency components, when the input pulse reaches the output terminal, whereby the front edge loses its sharpness. Furthermore, if the delay line is lengthened, its volume becomes larger, and the delay time cannot be changed easily.

Apart from a delay line it is also known to employ a delayed pulse signal generator which generates sawtooth waves and applies these and a reference DC voltage to a comparison circuit, and thus generates a pulse when the sawtooth wave reaches the DC voltage. In such a delayed pulse signal generator, although alteration of the DC voltage provides a ready means of varying the delay time, the slope of the sawtooth waveform must be small in order to obtain a long delay time, thereby resulting in a large uncertainty or jitter in the delay time.

SUMMARY AND OBJECTS OF THE INVENTION

The object of this invention is to provide a delayed pulse signal generator which combines the advantages of causing a quite small jitter even when delay time is prolonged, permitting easy alteration of the delay time, easily permitting prolongation of the delay time and of a small volume in comparison with a delay line.

According to the present invention there is provided a delay pulse signal generator comprising an input terminal for receiving an input pulse, an oscillator arranged to commence oscillation in response to an input pulse applied to the input terminal, a detecting circuit for detecting a predetermined number of cycles of oscillation and then generating an output pulse, and an output terminal for feeding out the pulse generated by the detecting circuit.

The invention will be described in more detail, by way of example, with reference to the accompanying drawings.

DETAILED DESCRIPTION OF THE ILLUSTRATED EMBODIMENT

Figures 1A, 1B, 1C:
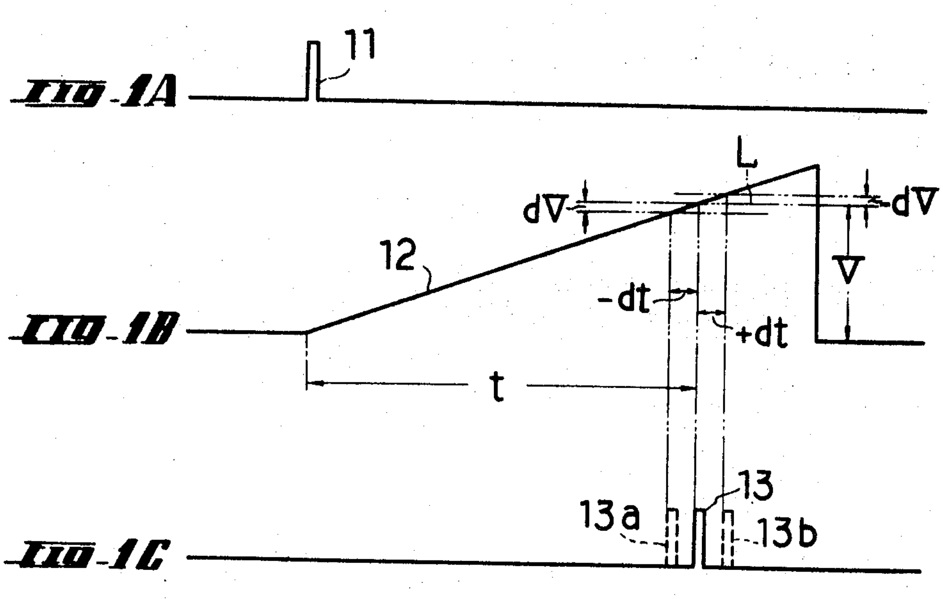
FIGS. 1A–1C are waveform diagrams relating to a prior art delayed pulse signal generator.

FIGS. 1A–1C illustrate waveforms pertaining to a known delayed pulse signal generator, which generates a sawtooth wave in response to an input pulse, applies the sawtooth wave and a DC voltage to a comparison circuit, and generates the output pulse when the sawtooth wave reaches the DC voltage. In this delayed pulse signal generator, when the input pulse 11 shown in FIG. 1A is applied to the sawtooth wave generating circuit, the sawtooth wave 12 shown in FIG. 1B is generated. This sawtooth wave 12 is applied to the comparison circuit, and is compared with a predetermined DC voltage V. Thus, after the application of the input pulse 11, a time $t$ elapses, the voltage of the sawtooth wave 12 gradually increasing to coincide with the DC voltage V, then resulting in a delayed pulse 13, shown in FIG. 1C, at the output terminal of the comparison circuit. .

In this case, because of noise in the comparison circuit and noise affecting the DC voltage V, voltage level L to be compared actually falls between $V-dV$ and $V+dV$, having a range of 2 $dV$. This also causes the pulse 13 obtained at the output terminal of the comparison circuit to become a pulse 13$a$ or 13$b$, having a delay time ranging from $t-dt$ to $t+dt$, thereby resulting in a jitter of $\pm dt$. The longer the required delay time $t$, the smaller the required inclination of the sawtooth wave 12 and hence the larger the jitter.

In this invention, such a defect is eliminated, and only a slight jitter is developed even when the delay time $t$ is prolonged.

Figure 2:
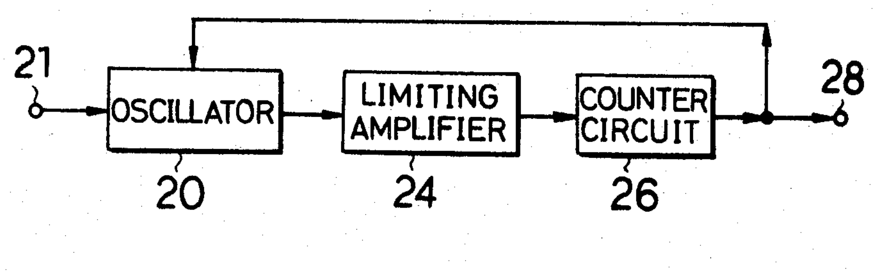
PRIOR ART FIG. 2
FIG. 2 is a block diagram of one embodiment of a delayed pulse signal generator in accordance with this invention.

FIG. 2 illustrates a block diagram of one embodiment of a delayed pulse signal generator in accordance with this invention. A controlled oscillator 20 is triggered by input pulses 22$a$ and 22$b$ shown in FIG. 3A.

Figures 3A, 3B, 3C, 3D:
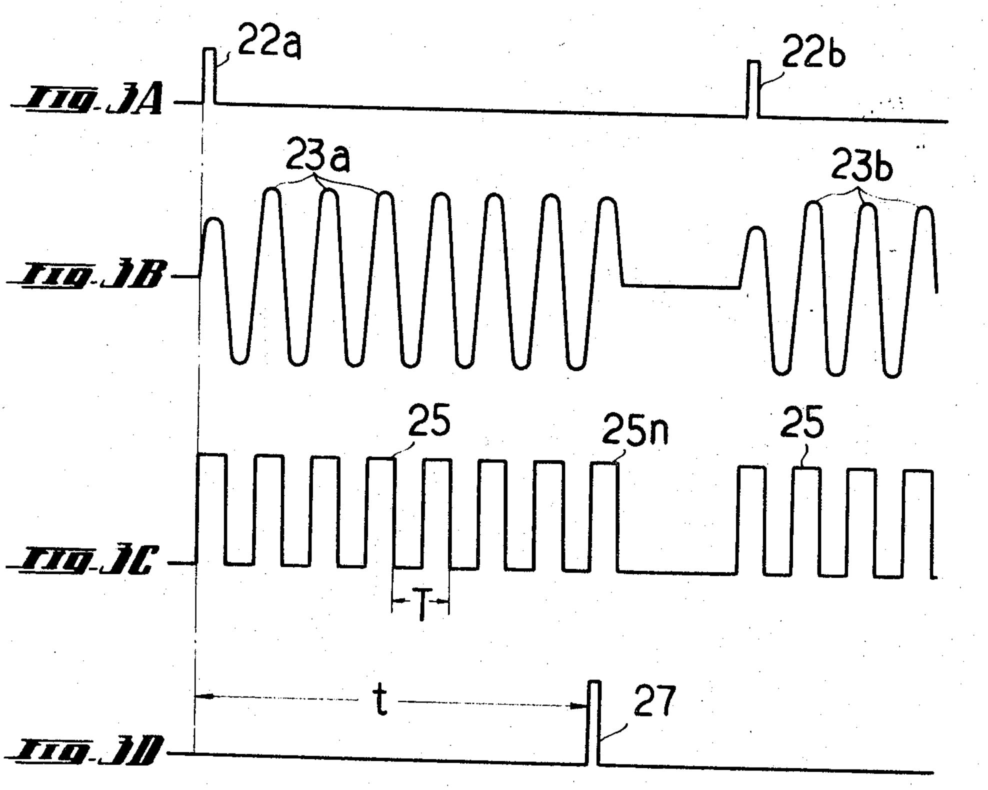
FIGS. 3A–3D are waveform diagrams relating to the delayed pulse signal generator shown in FIG. 2.

When input pulses 22$a$ and 22$b$ are applied to an input terminal 21 of the oscillator 20, the oscillator 20 initiates oscillation in phase synchronism with the input pulses 22$a$ and 22$b$, thereby, generating an oscillating output waveform 23$a$ and 23$b$, shown in FIG. 3B, at the output terminal of the oscillator 20. The output of the controlled oscillator 20 is applied to a limiting amplifier 24, and is thus amplified and limited. Consequently, at the output terminal of the limiting amplifier 24, a pulse train 25 shown in FIG. 3C is obtained, and this train 25 is applied to a detecting circuit or counter ciricuit 26, e.g. a ring counter circuit. When the counter circuit 26 completes the count of a certain predetermined number of cycles (i.e. a number $n$ of pulses), that is to say when the $n$th pulse 25$n$ is detected, a pulse 27 shown in FIG. 3D is generated, thereby resulting in a delayed output pulse 27 delayed by a predetermined delay time $t$ at the output terminal 28.

The pulse 27 is also fed back and applied to the controlled oscillator 20 to stop the oscillations whereby only the $n$ cycles are generated ($n$ being 8 as illustrated in FIG. 3C). When the next input pulse 22$b$ shown in FIG. 3A is applied to the input terminal 21, the aforementioned action is repeated. In this case, the amplitude and phase of the oscillating output waveform 23$b$ resulting from the input pulse 22$b$ has the same relationship with input pulse 22$b$ as the amplitude and phase of the oscillating output waveform 23$a$ has with the input pulse 22$a$.

Assume that the period or pulse interval of the pulses of the output waveforms 23*a* and 23*b* of the controlled oscillator 20 is T, the delay time $t$ is indicated as $$t=(n-1)T+dt \quad (1)$$

where $dt$ represents the algebraic sum of the time from when the input pulse 22*a* or 22*b* shown in FIG. 3A is applied to the controlled oscillator 20 up to when the oscillation shown in FIG. 3B is initiated, the time from when the $n$th pulse 25*n* of the pulse train 25 shown in FIG. 3C is applied up to when the pulse 27 shown in FIG. 3D is generated, and any other small delays. As illustrated, the pulse 27 shown in FIG. 3D is generated off the front edge of the pulse 25*n* shown in FIG. 3C, but if it is generated off the falling edge, the width of the pulse 25*n* is added to $dt$. In contrast to the prior art discussed above, $dt$ is not subjected to appreciable fluctuation.

Alteration of the delay time $t$ can be quite easily attained by varying the period T and/or the predetermined number $n$ of pulses.

Figure 4:
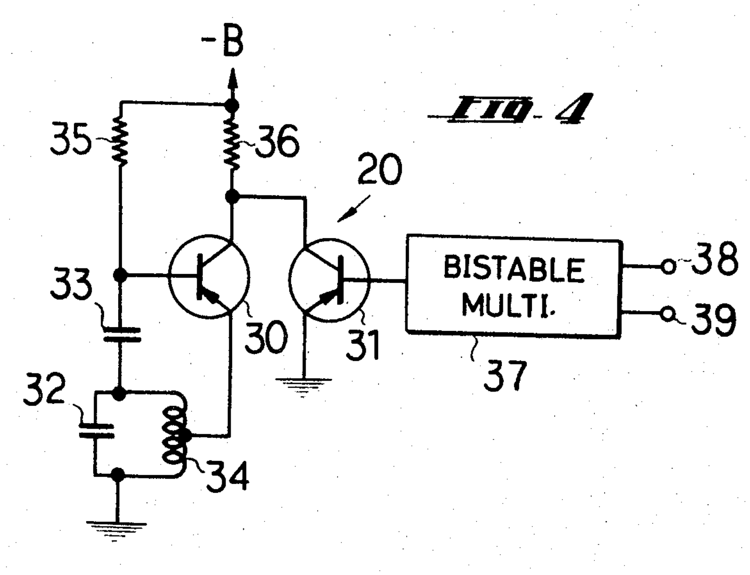
FIG. 4 is a circuit diagram of one embodiment of the controlled oscillator shown in FIG. 2.

The circuit diagram of one embodiment of the controlled oscillator 20 shown in FIG. 2 is illustrated in FIG. 4. In this illustration, so long as a transistor 31 is maintained in a conductive state by means of bistable multivibrator 37, a transistor 30 develops no oscillations because the collector voltage of the transistors 30 and 31 is held near 0 volt. When the input pulse 22*a* or 22*b* shown in FIG. 3A is applied to an input terminal 38 (connected to the terminal 21 of FIG. 2), the bistable multivibrator 37 is switched over and brings the transistor 31 into a non-conductive state. The transistor 30 then oscillates, and its oscillating output 23*a* or 23*b* (FIG. 3B) is obtained at its collector. The bistable multivibrator 37 is reset to bring the transistor 31 into the conductive state after the delay time $t$ has elapsed and the pulse 27 shown in FIG. 3D is applied to a terminal 39 (connected to the terminal 28 of FIG. 2). The transistor 30 stops oscillation as shown in FIG. 3B. While the oscillating output waveform 23*a* or 23*b* is obtained in this way, the period T of the pulses of the pulse train 25 derived from the waveform 23*a* or 23*b* is determined by a capacitor 32 and inductor 34. As a result, the period T is hardly affected by noise variations in the source voltage, etc., and is therefore quite stable. In addition, if the period T is stable, the delay time $t$, which is a digital function of the period T and is little influenced by other factors as indicated in Equation 1, is quite stable.

The oscillator is completed by a capacitor 33 and resistors 35 and 36.

In the described embodiment, oscillation of the controlled oscillator 20 was made in synchronism with input pulse 22*a* or 22*b*, but by suitable means, e.g. by means of a short delay line, such oscillation may be commenced with a delay of predetermined time which is shorter than the delay time $t$ of the delayed pulse 27.

A counter circuit 26 has been described as the detecting circuit. However, when a sawtooth wave formed in synchronism with the input pulse 22*a* or 22*b*, and the pulse train 25 are superimposed, and this superimposed waveform and a suitable DC voltage are applied to a comparison circuit acting as the detecting circuit, thus detecting coincidence of the voltage levels of both, the delayed pulse 27 may be generated. In this case, alteration of the DC voltage enables the number $n$ to be varied, thereby enabling the delay time $t$ to be easily changed.

Apart from the above, by applying the pulse train 25 to a blocking oscillator which employs a transistor, a monostable multivibrator which may or may not employ a tunnel diode or Esaki diode, and so forth, it is possible to obtain the output pulse 27 when the $n$th pulse 25*n* of the pulse train 25 is generated.

Moreover, instead of a ring counter 26, cascaded flip-flop circuits can be used.

As illustrated in FIG. 4, an LC oscillator with a capacitor 32 and an inductor 34 is used as the controlled oscillator 20, but a CR oscillator with a capacitor and a resistor may be used. In order further to enhance stability, a quartz oscillator which utilizes the piezo-electric effect of a quartz plate may be employed.

If the output of the controlled oscillator 20 is big enough, this output may be applied directly to the counter circuit 26, omitting the limiting amplifier 24.

Other changes are of course possible within the scope of the invention.

What is claimed is:

1. A delayed pulse signal generator comprising an input terminal for receiving an input pulse, an oscillator arranged to commence oscillation in response to an input pulse applied to the input terminal, a detecting circuit for detecting a predetermined number of cycles of oscillation and then generating an output pulse, and an output terminal for feeding out the pulse generator by the detecting circuit.

2. A delayed pulse signal generator according to claim 1, wherein the oscillator is, during its oscillation, responsive to the said output pulse to stop oscillating.

3. A delayed pulse signal generator according to claim 1, wherein the oscillator commences oscillation in synchronism with the input pulse.

4. A delayed pulse signal generator according to claim 1, comprising a limiting amplifier to which the output of the oscillator is applied to be amplified and limited, the output of the limiting amplifier being applied to the detecting circuit.

5. A delayed pulse signal generator according to claim 1, wherein the detecting circuit is a counter circuit for counting the said number of cycles of oscillation.

6. A delayed pulse signal generator according to claim 5, wherein the counter circuit is a ring counter.

References Cited

UNITED STATES PATENTS

| | | | |
|---|---|---|---|
| 2,900,505 | 8/1959 | Page ------------ | 331—173X |
| 3,267,289 | 8/1966 | Washington et al. --- | 307—293X |
| 3,463,941 | 8/1969 | McLendon et al. --- | 328—55X |

ROY LAKE, Primary Examiner

S. H. GRIMM, Assistant Examiner

U.S. Cl. X.R.

307—293; 328—55; 331—117